United States Patent
Yang et al.

(10) Patent No.: US 7,336,074 B2
(45) Date of Patent: Feb. 26, 2008

(54) ACTIVE DECOUPLING OF MRI RF TRANSMIT COILS

(75) Inventors: Xiaoyu Yang, Indiana, PA (US); Hiroyuki Fujita, Highland Heights, OH (US); Tsinghua Zheng, Aurora, OH (US)

(73) Assignee: Quality Electrodynamics, Mayfield Village, OH (US)

( * ) Notice: Subject to any disclaimer, the term of this patent is extended or adjusted under 35 U.S.C. 154(b) by 0 days.

(21) Appl. No.: 11/418,456

(22) Filed: May 5, 2006

(65) Prior Publication Data

US 2007/0273377 A1    Nov. 29, 2007

(51) Int. Cl.
*G01V 3/00* (2006.01)
(52) U.S. Cl. ..................... 324/318; 324/309
(58) Field of Classification Search ........ 324/300–322; 600/410–445
See application file for complete search history.

(56) References Cited

U.S. PATENT DOCUMENTS

| | | | |
|---|---|---|---|
| 4,825,162 A | 4/1989 | Roemer et al. | |
| 5,198,768 A | 3/1993 | Keren | |
| 5,430,378 A | 7/1995 | Jones | |
| 5,548,218 A | 8/1996 | Lu | |
| 5,910,728 A | 6/1999 | Sodickson | |
| 6,411,090 B1 * | 6/2002 | Boskamp | 324/318 |
| 6,879,158 B2 * | 4/2005 | Zhu | 324/318 |
| 6,906,518 B2 * | 6/2005 | Leussler | 324/318 |
| 6,982,554 B2 * | 1/2006 | Kurpad et al. | 324/318 |
| 7,141,973 B2 * | 11/2006 | King et al. | 324/314 |

OTHER PUBLICATIONS

Sodickson et al.; "Simultaneous Acquisition of Spatial Harmonics (SMASH): Fast Imaging with Radiofrequency Coil Arrays"; MRM 38:591-603 (1997).
Katscher, U. et al.; "Transmit SENSE"; Magnetic Resonance in Medicine 49:144-150 (2003).
Kurpad et al.; "A Parallel Transmit Volume Coil With Independent Control of Currents on the Array Elements"; Proc. Intl. Soc. Mag. Reson. Med. 13 (2005).
Pruessmann et al.; "SENSE: Sensitivity Encoding for Fast MRI"; Magnetic Resonance in Medicine 42:952-962 (1999).

* cited by examiner

*Primary Examiner*—Brij Shrivastav
(74) *Attorney, Agent, or Firm*—Nixon & Vanderhye P.C.

(57) ABSTRACT

An MRI RF transmit system uses a plurality of RF transmit coils, each being driven with separately controllable RF magnitude and phase. The magnitude and phase of each coil drive are separately and independently controlled so that the RF transmit coils act as if they are decoupled from each other. The controlled magnitude and phase values may be based on empirically derived information relating to self and mutual coupling of RF transmit coils.

40 Claims, 7 Drawing Sheets

ACTIVE DECOUPLING OF MRI RF TRANSMIT COILS

BACKGROUND

1. Technical Field

Plural MRI RF transmit coils are actively decoupled from one another. This is especially useful for Sensitivity Encoding for Fast MRI (SENSE).

2. Related Art

Magnetic resonance imaging (MRI) utilizes a strong, uniform and static magnetic field $B_0$ to polarize the magnetic moment of nuclear spins in a human body or other objects. The magnetically polarized nuclear spins generate a net magnetization which points in the direction of magnetic field $B_0$. However, this produces no useful information unless disturbed by some excitation.

The generation of a nuclear magnetic resonance (NMR) signal for MRI data acquisition is achieved by exciting the nuclear magnetic moments with a uniform radiofrequency (RF) magnetic field $B_1$ at the Larmor frequency for those nuclei that are to be excited. An RF transmit coil emits the $B_1$ field in an imaging region of interest (ROI) when driven by a computer-controlled RF transmit unit. The most common type of RF transmit coil is a birdcage body coil.

Figure 1:
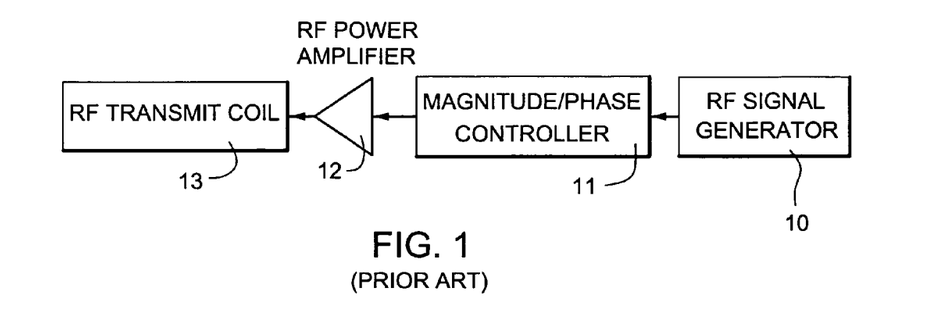
FIG. 1 is a schematic diagram of a known RF transmit coil system.

FIG. 1 shows a traditional RF transmit coil 13 and a computer-controlled RF transmit unit including an RF signal generator 10, a magnitude/phase controller 11 and an RF Power amplifier 12. Typically, the transmit unit includes only one RF power amplifier. This RF power amplifier may possess a huge power rating (e.g., exceeding 30 KW for a 3T MRI system).

During excitation by the RF transmit coil, the nuclei that are at their Larmor resonance absorb magnetic energy, and their respective magnetic moments (spins) precess around and are rotated away from the direction of magnetic field $B_0$. After excitation, the precessing angularly displaced magnetic moments undergo free induction decay back to alignment with $B_0$. During this free induction decay, the nuclei emit their absorbed energy as RF signals as they return to steady state condition. An RF receiving coil positioned in the vicinity of the excited nuclei detects an RF NMR signal. The NMR signal is represented as an electromotive force (voltage) in the receiving RF coil that has been induced by a flux change over some time period due to the relaxation of precessing magnetic moments. This signal provides contrast information for an image.

The receive RF coil may comprise either the transmit coil itself using a Transmit/Receive (T/R) switch or an independent receive-only RF coil. The NMR signal is spatially modulated for producing magnetic resonance images by utilizing additional pulsed magnetic gradient fields, which are generated by gradient coils which vary linearly with respect to spatial coordinates in the imaging volume and thus serve to spatially phase encode the RF NMR signals. Gradient field(s) can also be used during RF excitation to selectively excite a specific sub-volume (e.g., a slice) of the ROI.

It is desirable in MRI for the RF excitation and reception to be spatially uniform in the ROI imaging volume for better image uniformity. In a typical MRI system, a whole-body volume RF transmit coil usually produces the best excitation field homogeneity. The whole-body volume coil is the largest RF transmit coil in the MRI system. The large size of this transmit coil, however, produces a lower signal-to-noise ratio (SNR) if it is also used for reception, mainly because of its greater distance from the signal-generating tissues being imaged. Since a high SNR is highly desirable in MRI, dedicated coils are often used for reception to enhance the SNR from the ROI.

In practice, a well-designed dedicated RF transmit coil should possess the following functional properties: a high SNR, good uniformity, a high unloaded quality factor (Q) of the resonant circuit, and a high ratio of the unloaded to loaded Q factors. In addition, the mechanical design of the coil should facilitate patient handling and comfort and provide safety protection between the patient and RF transmit coil electrical conductors.

Quadrature reception provides another way to increase the SNR. In quadrature reception, two independent (i.e., decoupled) individual RF receiving coils detect NMR signals in two orthogonal modes, which may be associated with planes transverse and perpendicular to the main magnetic field $B_0$. The two receiving coils cover the same volume of interest. With quadrature reception, the SNR may be increased by up to $\sqrt{2}$ over that of individual non-QD coils.

A linear surface coil array technique in MRI may cover a large field-of-view (FOV), while maintaining the SNR characteristics of a small and conformal coil. A linear surface coil array technique may be used to image an entire human spine (see U.S. Pat. No. 4,825,162). Other linear surface array coils have been used for C.L. spine imaging (see U.S. Pat. No. 5,198,768). These devices may comprise an array of planar linear surface coil elements. However, these coil systems do not work well for imaging deep tissues, such as the blood vessels in the lower abdomen, due to a drop-off in sensitivity at positions not so close to the surface coil.

Quadrature phased array coils have been utilized to image the lower extremities (see U.S. Pat. Nos. 5,430,378 and 5,548,218). Quadrature phased arrays may image the lower extremities by using two orthogonal linear coil arrays: (i) six planar loop coil elements placed in the horizontal plane and underneath the patient and (ii) six planar loop coil elements placed in the vertical plane and in between the patient's legs. Each linear coil array functions in a similar way as described in U.S. Pat. No. 4,825,162. A second quadrature phased array coil has been designed to image blood vessels from the pelvis down. This device also comprises two orthogonal linear coil arrays extending in the patient's head-to-toe direction: a planar array of loop coil elements laterally and centrally located on top of a second array of butterfly (also referred to as "figure-8") coil elements. The loop coils are placed immediately underneath the patient and the butterfly coils are wrapped around the patient. Again, each linear coil array typically functions in a way similar to that described in U.S. Pat. No. 4,825,162.

Gradient coils are routinely used in MRI to provide phase-encoding information to RF MRI signals. To obtain an image, all data points in a so-called "k-space" (i.e., frequency space) are typically collected. Recently, there have been developments where some of the data points in k-space are intentionally skipped. Time intrinsic sensitivity information of RF receive coils are used to phase-encode information for the skipped data points. These operations occur simultaneously and are thus referred to as parallel imaging. Collecting multiple data points simultaneously requires less time to acquire the same amount of data when compared with conventional gradient-only phase-encoding. Time savings may be used to reduce total imaging time, which is particularly helpful for those applications in which cardiac or respiratory motions in imaged tissues cause concern. The time savings may alternatively be used to collect more data to achieve better resolution or SNR. SiMultaneous Acquisition of Spatial Harmonics, SMASH, (U.S. Pat. No. 5,910, 728) and "Simultaneous Acquisition of Spatial Harmonics (SMASH): Fast Imaging with Radiofrequency Coil Arrays," Daniel K. Sodickson and Warren J. Manning, Magnetic Resonance in Medicine 38:591-603 (1997), (both of which are incorporated herein by reference) and "SENSE: Sensitivity Encoding for Fast MRI," Klaas P. Pruessmann, et. al., Magnetic Resonance in Medicine 42: 952-962 (1999), (also incorporated herein by reference), disclose two techniques of parallel imaging. The SMASH technique takes advantage of parallel imaging by skipping phase encode lines that yield a reduction in a Field-of-View (FOV) in the phase-encoding direction and uses spatial harmonics produced by coil arrays to fill in the missing data points in k-space. The SENSE technique, on the other hand, utilizes an aliased image obtained as a result of skipping some k-space data points and then unfolds the aliased image in x-space (i.e., real space) by using individual RF transmit coil sensitivity information in the RF transmit coil arrays.

The SENSE and SMASH techniques, or a hybrid approach of both, demand new design requirements in RF transmit coil design. In SMASH, the primary criterion for the array is that it be capable of generating sinusoids whose wavelengths are on the order of the FOV. This is how the target FOV along the phase encoding direction for the array is determined. Conventional array designs can incorporate element and array dimensions that will give an optimal SNR for the object of interest. In addition, users of conventional arrays are free to choose practically any FOV, as long as severe aliasing artifacts are not a problem. In contrast, when using SMASH, the size of the array determines the approximate range of FOVs that can be used in imaging. This range determines the approximate element dimensions, assuming complete coverage of the FOV is desired, as in most cases.

The SENSE method is based upon the sensitivity of an RF receive coil generally having a phase-encoding effect complementary to those achieved by linear field gradients. For SENSE imaging, the elements of a coil array may be smaller than for common/conventional phased-array coils, thereby resulting in a trade-off between basic noise and geometry factor (referred to as g-factor). Designs where adjacent coil elements are not overlapped have been suggested for a net gain in SNR due to the improved g-factor when using $$\text{SENSE}\left(SNR(\text{SENSE}) = \frac{SNR(\text{Full})}{g\sqrt{R}}\right)$$

where R is a reduction factor.

A Transmit-SENSE method has been suggested to address specific absorption rate (SAR) issues as the static main magnetic field $B_0$ becomes larger (e.g., greater than 3T—see U. Katscher, et al., Magnetic Resonance in Medicine 49: 144-150 (2003)). To illustrate the idea of Transmit-SENSE, multiple RF transmit coils are placed around the human body being imaged. Each RF transmit coil can deliver its own $B_1$ field with different phase and magnitude. The resultant $B_1$ field is the sum of the fields from all the RF transmit coils. One of the requirements to implement Transmit-SENSE successfully is that all the RF transmit coils be mutually decoupled from each other. However, achieving an adequate level of decoupling among all the transmit coils becomes challenging as the total number of transmit coils increases. Achieving adequate decoupling between the transmit coils is a problem because conventional decoupling techniques such as a low input-impedance preamp decoupling method used in RF receive array coils are difficult to realize in RF transmit coils. That is, known methods used to decouple RF receive coils are not readily transferable to decouple RF transmit coils. One of the decoupling methods proposed by K. N. Kurpad, et al., "A Parallel Transmit Volume Coil with Independent Control of Currents on the Array Elements," Proceedings of International Society for Magnetic Resonance in Medicine 13 (2005), uses a high impedance current source to drive the RF transmit coil. However, implementing this method may not be economical. For example, the power source used in this method is not an industry standard 50 Ohm impedance power RF amplifier.

SUMMARY

Such problems can be reduced by using a separate RF signal magnitude and phase control for each of plural RF transmit coils such that the RF transmit coils act as if they are decoupled from each other.

An RF power amplifier and power splitter such as a 50 ohm RF power splitter may be used or an RF signal generator and signal splitter may be used with separate power amplifiers in each magnitude/phase control channel. Directional couplers and/or transmit/receive switches may be respectively connected between the plurality of magnitude/phase controllers and RF transmit coils. A computer system may generate a plurality of separate magnitude/phase control signals based on previously acquired mutual coupling information for the RF transmit coils. The mutual coupling information may be empirically derived information obtained (e.g., for a given patient or patient type) as a short (e.g., a few seconds) pre-imaging experiment conducted by the MRI controller. The computer system may generate a plurality of separate control signals based on information (e.g., empirically derived information) relating to each coil self resistance, mutual inductance and mutual impedance and then respectively provide the plural control signals to respective ones of the plurality of magnitude/phase controllers. The control information may form a matrix M, an entry $M_{ij}$ of the matrix M representing information relating to a transmit coil self resistance when i=j, and representing information relating to the mutual inductance and mutual impedance between that coil and another of the transmit coils when i≠j.

The operation of the MRI system to obtain the empirical data may be performed using a patient and the subsequent operation of the MRI system may comprise an MRI scan (of the same or a different but similar type of patient).

A method of operating an MRI system to acquire the required empirical data may drive a first RF transmit coil by driving the first RF transmit coil with a signal having a predetermined magnitude and phase while measuring forwarded (i.e., mutually coupled) power at a second RF transmit coil. Mutual coupling information (e.g., mutual inductance and mutual impedance information) between the first and second RF transmit coils can be derived based on the measured forwarded power and the driving signal having predetermined magnitude and phase. Subsequently, the first and second RF transmit coils can then be driven under separate magnitude/phase control based on the acquired mutual coupling information so that the first and second RF transmit coils act as if they are decoupled from one another. The forwarded power measured at the second RF transmit coil may be measured, for example, by using a directional coupler connected to the second RF transmit coil.

The method of acquiring self-coupling data may involve generating another magnetic field from the first (or second) RF transmit coil by driving the first RF transmit coil with another signal having a predetermined magnitude and phase and measuring (by, e.g., a directional coupler) reflected power at the first (or second) RF transmit coil. Self resistance of the first (or second) RF transmit coil can be determined based on the measured reflected power and the driving signal having predetermined magnitude and phase. The control for driving the first and second RF transmit coils can then also be based on the acquired self resistance of the first (or second) RF transmit coil as well as the mutual coupling therebetween. The self resistance of the first RF transmit coil, the self resistance of the second RF transmit coil, and their mutual coupling data can form a matrix M in which matrix entry $M_{11}$ represents self resistance of the first RF transmit coil, matrix entries $M_{12}$ and $M_{21}$ represents mutual coupling in both directions, and matrix entry $M_{22}$ represents self resistance of the second RF transmit coil.

This same technique can be extended to N RF transmit coils. For example, a first RF transmit coil can be driven with a signal having a predetermined magnitude and phase while measuring forwarded power at each of the other N−1 RF transmit coils. Mutual coupling between the driven RF transmit coil and each of the other N−1 RF transmit coils can be determined based on the measured forwarded (i.e. coupled) power and the driven signal predetermined magnitude and phase. By driving each successive coil while collecting data from the others, a complete control matrix for all N coils can be derived. Thereafter each of the RF transmit coils can be driven during MRI using separate magnitude/phase control based on the derived self and mutual coupling information such that each of the RF transmit coils act as if they are decoupled from one another.

An MRI system having a plurality of RF transmit coils coupled to an object imaging volume can then be operated in a parallel SENSE imaging process.

Preferably the magnitude/phase control data is derived in a short pre-imaging experiment while the object to be imaged is present in the imaging volume (e.g., because the characteristics of the object to be imaged typically affects the mutual inductance of the coils). However, if mutual coupling data is derived for a given type of patient (e.g., sex, weight, body build, etc), it may suffice for use with other patients of the same type. A suitable test phantom may be used if it sufficiently approximates the patient to be imaged.

BRIEF DESCRIPTION OF THE DRAWINGS

These and other objects and advantages of the herein described exemplary embodiments will be more completely understood and appreciated by careful study of the following more detailed description in conjunction with the accompanying drawings, in which.

DETAILED DESCRIPTION OF EXEMPLARY EMBODIMENTS

Figure 2:
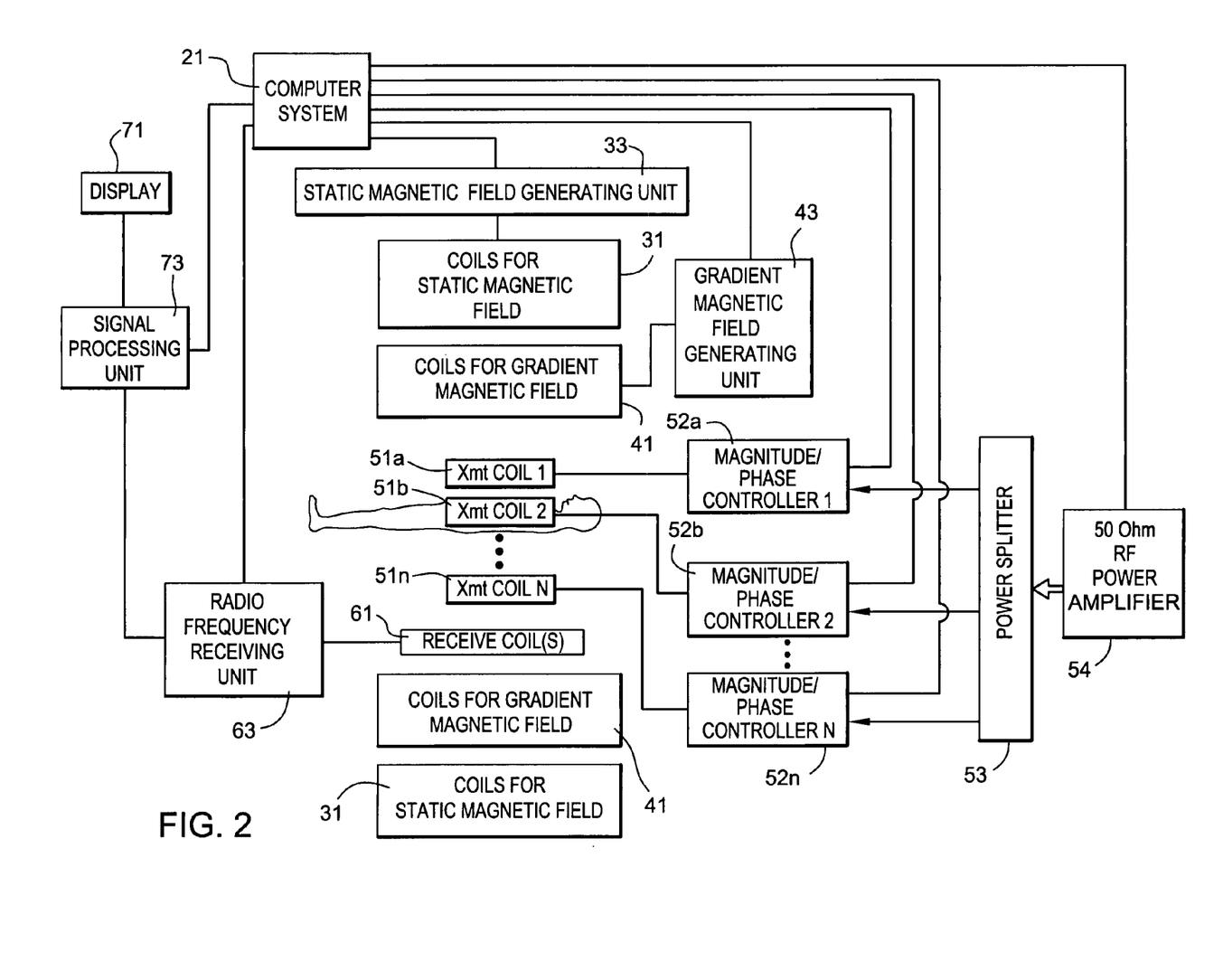
FIG. 2 is an overall system-wide schematic view of an exemplary MRI system in accordance with one non-limiting, exemplary embodiment.

FIG. 2 is a general overview of major components of an exemplary MRI system. The exemplary MRI system includes static magnetic field coils 31, gradient magnetic field coils 41, a plurality of N separate RF transmit coils 51a-51n and RF receive coils 61. A computer system 21 controls gradient magnetic field coils 41 and RF receive coil(s) 61 through respective units 43 and 63 (and may in some circumstances have some control associated with static magnetic field coils 31 via unit 33). Computer system 21 communicates with signal processing unit 73 which is capable of generating a display resulting from an MRI application on display 71. While transmit coils 51a-51n and receive coil(s) 61 are depicted as separate coils, those skilled in the art will appreciate that the same coil may be used for transmitting and receiving RF signals in an MRI application provided that the proper T/R switching and control circuitry is provided.

Figure 3:
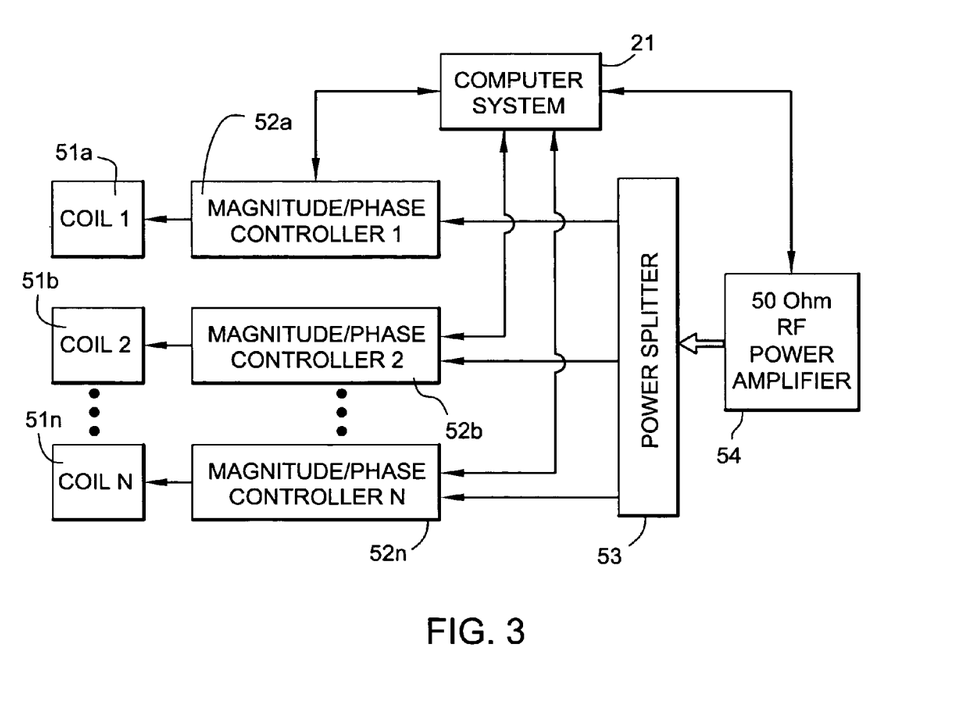
FIG. 3 is an exemplary block diagram of an RF transmit system which may be utilized in the MRI system illustrated in FIG. 2.

Computer system 21 also controls an RF transmit system including RF transmit coils 51a-51n for generating appropriate RF drive signals for each of the RF transmit coils 51a-51n. The RF transmit system includes, in this exemplary embodiment, a single standard 50 ohm RF power amplifier 54, a power splitter 53 and individual magnitude/phase controllers 52a-52n. FIG. 3 shows the RF transmit system, transmit coils 51a-51n and computer system 21 apart from the remaining portions of the MRI system illustrated in FIG. 2 for purposes of clarity.

Computer system 21 separately and independently controls each magnitude/phase controller 52a-52n. The magnitude and phase of the RF power respectively driving each RF transmit coil 51a-51n can therefore be separately and independently manipulated. As will be discussed in more detail below, for example, the magnitude and phase of each magnitude/phase controller 52a-52n may be separately and independently manipulated to effectively decouple transmit coils 51a-51n from each other when these transmit coils are generating components of a composite resultant excitation $B_1$ field. A highly uniform excitation $B_1$ field can thus be obtained. The appropriate magnitude and phase of each signal driving transmit coils 51a-51n is determined using empirically derived data so that these coils act as if they are decoupled when providing their respective $B_1$ field components.

Figure 4:
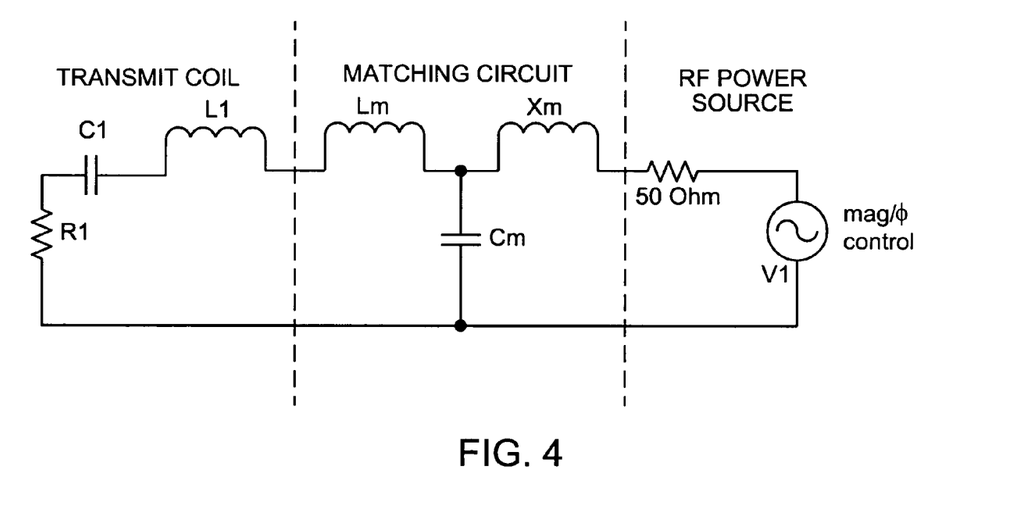
FIG. 4 is a schematic diagram showing an equivalent circuit of various components of the system illustrated in FIG. 3.

FIG. 4 is a schematic showing an equivalent circuit of one channel of the RF transmit system. The equivalent circuit is composed of three parts (illustrated from left to right in FIG. 4): a transmit coil ($L_1$), a matching circuit ($L_m$, $X_m$, $C_m$) and an RF power source ($V_1$). The RF power source generates RF power and includes magnitude/phase controller 52a, 52b or 52n illustrated in FIG. 3. The magnitude and phase of RF power in each channel of the RF can be modulated separately and independently from RF power provided in other channels. $R_1$ is the equivalent resistive loss of the transmit coil due to conductive metal (e.g., copper) loss and phantom loss. The value of resistive loss $R_1$ is determined by a coil loading condition. The transmit coil capacitance and inductance are represented by $C_1$ and $L_1$, respectively. The capacitance $C_1$ and inductance $L_1$ of the coil resonate with each other at a desired frequency $\omega_0$. In the matching circuit, $L_m$ represents the residual inductance from the coil, $C_m$ represents the matching capacitor, and $X_m$ represents the matching capacitor or inductor. $L_m$, $C_m$ and $X_m$ form the matching circuit which transforms a standard 50 ohm RF power impedance to the $R_1$ impedance of the coil loss for optimum power transmission.

Figure 5:
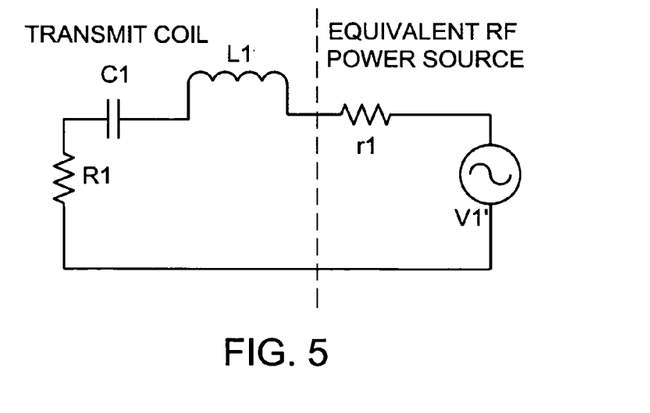
FIG. 5 is a schematic diagram showing a simplified version of the equivalent circuit illustrated in FIG. 4.

FIG. 5 is a schematic diagram showing a simplified version of the equivalent circuit illustrated in FIG. 4. In this simplified version, the equivalent circuit is composed of two parts: an equivalent RF power source and a transmit coil. The value of $r_1$ is equal to the value of $R_1$ for a standard phantom. $V_1'$ represents the equivalent voltage source transformed from $V_1$ of FIG. 4. $V_1'$ can be written as $f_1(V_1)$ so that $f_1(x)$ is the transformation function and is determined by $L_m$, $C_m$, and $X_m$.

When the coil of FIG. 5 is tuned alone on a standard phantom, the circuit can be described by following equation $$I_1 \times (R_1 + r_1) - i\frac{1}{\omega_0 C_1} + i\omega_0 L_1 = \quad \text{(Eq. 1)}$$
$$I_1 \times R_1' - i\frac{1}{\omega_0 C_1} + i\omega_0 L_1 = I_1 \times R_1' = V_1'$$

where $I_1$ is the current going through the circuit, i is an imaginary symbol and $R_1' = R_1 + r_1$. At the resonant frequency $\omega_0$, the impedances from $C_1$ and $L_1$ cancel each other.

When N transmit coils are arranged together to compose a coil array, there may exist mutual inductance and mutual E field coupling between any two coils. The mutual inductance between coils i and j is defined as $M_{ij}$. The mutual E field coupling can be characterized as the mutual impedance R. This mutual E field coupling can separated into two categories: (i) a first category in which two coils share a non-lossy E field (i.e., the two coils couple to each other capacitively), and (ii) a second category in which two coils share a pure lossy E field (i.e. the two coils couple to each other resistively). Mutual impedance $R_{ij}$ is defined as a mutual coupling coefficient (capacitively and resistively) between i and j transmit coils. The mutual E field coupling effect usually becomes stronger when $B_0$ field increases. B field coupling is considered here to be separate from the two above noted categories of E field coupling because MRI is a magnetic coupling modality and the B field is considered to be the dominant part of the entire coupling except in extreme cases. Eq. 1 is then changed to the following form:

$$I_i \times R_i' + \sum_{j=1}^{N} (i\omega_0 M_{ij} + R_{ij}) I_j = V_i' \quad \text{(Eq. 2)}$$

i.e.

$$(I_1, I_2, \ldots, I_N) \times \begin{bmatrix} R_1' & i\omega_0 M_{12} + R_{12} & \ldots & i\omega_0 M_{1N} + R_{1N} \\ i\omega_0 M_{21} + R_{21} & R_2' & \ldots & i\omega_0 M_{2N} + R_{2N} \\ \ldots & \ldots & \ldots & \ldots \\ i\omega_0 M_{N1} + R_{N1} & i\omega_0 M_{N2} + R_{N2} & \ldots & R_N \end{bmatrix} = \quad \text{(Eq. 3)}$$
$$(V_1', V_2', \ldots, V_N')$$

or $$I \times M = V' \quad \text{(Eq. 4)}$$

where I is the matrix of the coil unit currents, M is the matrix (coupling matrix) of the self resistance, mutual inductance and mutual impedance of the transmit coils and V' is the driving voltage matrix. The mutual inductance and impedance between coils i and j is not the direct mutual coupling only between coils i and j. It is the coupling between coils i and j with all other coils (and the patient tissue to be imaged or something similar thereto) present. In other words, the coupling between coils i and j is the sum of direct coupling between coils i and j and indirect coupling between coils i and j through other coils and environments, such as a patient or phantom.

The number of indirect coupling paths can be enormous, (i.e., the first order coupling, the second order coupling, etc.). The definition of the first order coupling between coils i and j is that coil i couples to coil k, coil k couples to coil j, and as a result coil i couples to coil j. The definition of $N_{th}$ order coupling is similar. Therefore, Eq. 4 can be rewritten as $$I = V' \times M^{-1} = V \quad \text{(Eq. 5)}$$

where V may be defined as a virtual RF power source matrix having dimensions 1(row)×N(column). Each unit of V is composed of all existing V' power sources at a preset magnitude and phase. The ith coil of V is defined as $V_i$. The virtual power source $V_i$ can only create current at coil i (i.e., its own $B_1$ field of coil i).

Figure 6:
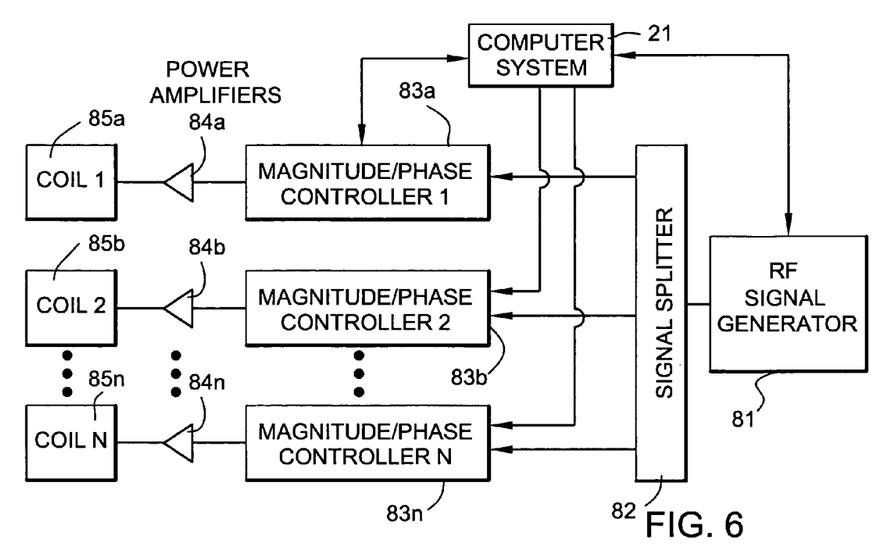
FIG. 6 is an exemplary schematic diagram of an RF transmit system which may be used in the MRI system illustrated in FIG. 2.
Figure 7:
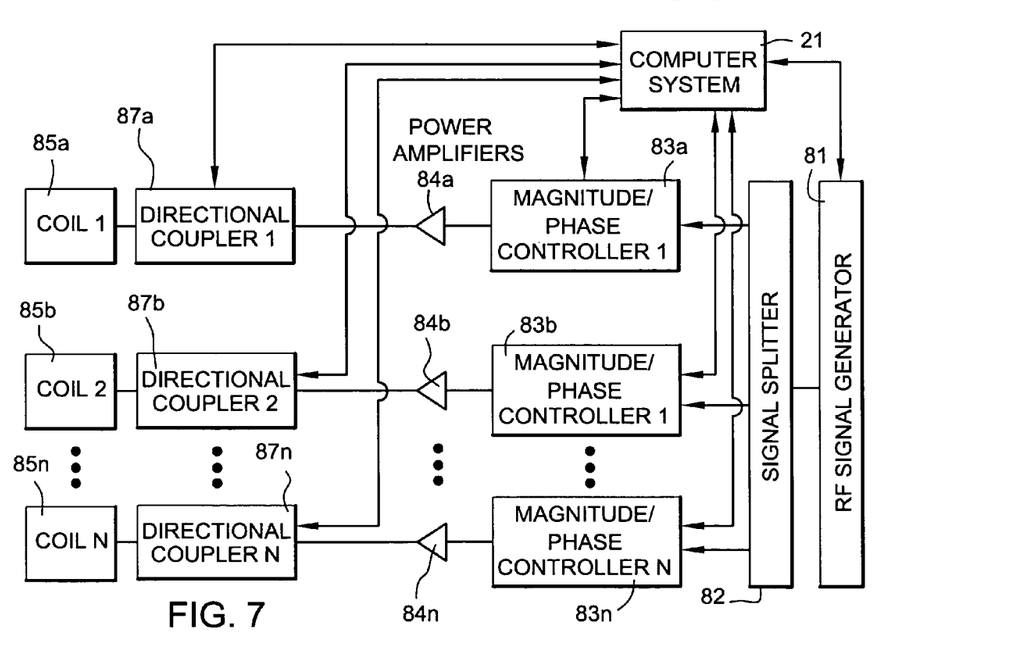
FIG. 7 is an exemplary schematic diagram of an RF transmit system for measuring a coupling matrix which may be used in the MRI system illustrated in FIG. 2.
Figure 9:
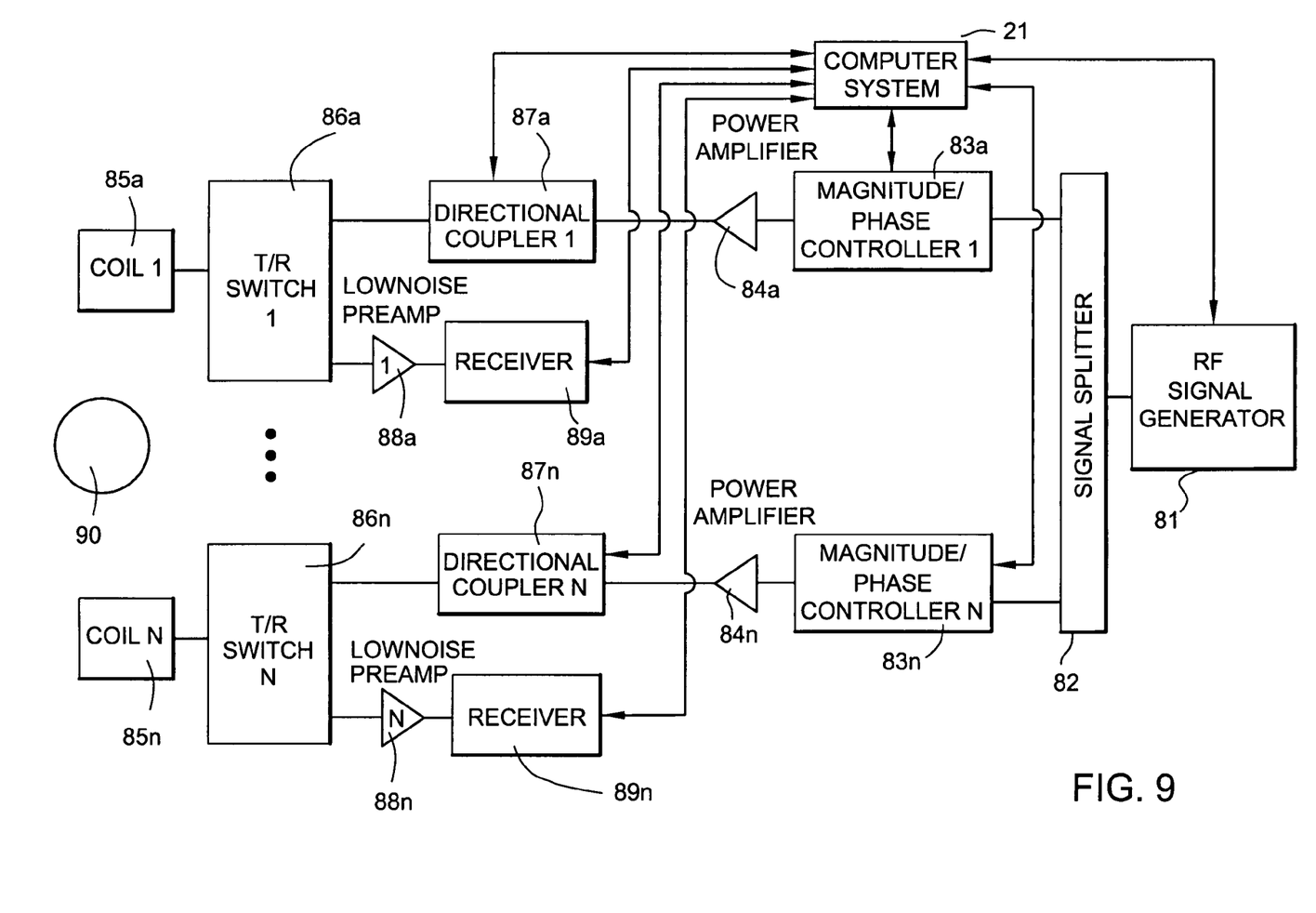
FIG. 9 is an exemplary schematic diagram of an RF transmit/receive system for measuring a coupling matrix which may be used in the MRI system illustrated in FIG. 2.

The preset magnitude and phase can be realized by computer-controlled magnitude and phase controllers (e.g., controllers 52a-52n in FIGS. 2-3 or controllers 88a-88n in FIGS. 6-7 and 9). In other words, the decoupling between transmit coils 51a-51n may be realized by using a controlled RF power supply to create an additional driving voltage to compensate for (i.e., cancel) the induced voltage from other coils due to mutual coupling. As a result, there is, in effect, no induced current flowing in the coils. This additional compensation voltage may be, if desired, determined from empirical data obtained by the same MRI system at a previous time.

For any given transmit coil RF power driving condition, the driving voltage matrix can be written as V'×A, where A is the driving magnitude/phase matrix of each coil. V'×A can be rewritten as $(V'M^{-1})M \times A$ (i.e., the coils are all considered decoupled with their magnitude/phase matrix as M×A). Controlling magnitude and phase of each coil separately and independently via phase/magnitude controllers 52a-52n greatly increases the ease of effectively isolating transmit coils.

Moreover, separate and independent control of the phase and amplitude for each RF transmit coil enables virtual coils to be generated. Consider, for example, if voltage $V_1'$ is applied to the coil 1 with all other coils enabled. $V_1'$ generates current $I_1$ in coil element 1. Due to mutual coupling, coupled currents are induced in all other coils. An extended $B_1$ field is thus generated, to which every coil contributes at different respective magnitude and phase. An ensemble of all coils with a different magnitude and phase is regarded as a "virtual coil" of $V_1'$. This "virtual coil" concept is similar to the "virtual power source" concept.

FIG. 6 shows an alternative exemplary embodiment of an RF transmit system which may be utilized in the MRI system illustrated in FIG. 2 in place of, for example, the embodiment illustrated in FIG. 3. This alternative RF transmit system includes an RF signal generator 81 (e.g., a low power RF signal generator), a signal splitter 82 (which can also be of lower power handling design), separately and independently controllable magnitude/phase controllers 83a-83n, power amplifiers 84a-84n and separate transmit coils 85a-85n. Computer system 21 controls magnitude/phase controllers 83a-83n separately and independently to provide coil decoupling when each of the transmit coils produces a $B_1$ field component for excitation in an MRI application. For example, the computer system 21 may control the magnitude/phase controllers 83a-83n in light of a coupling matrix (discussed above), to create an additional voltage to compensate for (i.e., substantially cancel) induced voltages from the other coils due to mutual coupling. Signal splitter 82 is a 1-to-N port device. Signal splitter 82 may possess a relatively low RF power rating and thus itself consume only a small amount of power. Computer controlled magnitude/phase controllers 83a-83n may also be low power devices. Power amplifiers 84a-84n are higher power devices. However, if transmit coils 85a-85n only excite a portion of an imaging object (e.g., a small portion of a human patient), the power rating of each power amplifier 84a-84n may be much less than the power rating of a traditional single RF power amplifier.

FIG. 7 shows an alternative embodiment of an RF transmit system which may be utilized in the MRI system illustrated in FIG. 2. The RF transmit system illustrated in FIG. 7 is capable of empirically determining mutual coupling information (e.g., mutual inductance and/or mutual impedance) between each pair of transmit coils 85a-85n as well as self resistance of each transmit coil 85a-85n. This empirically determined information may form a coupling matrix used by computer system 21 to separately and independently control magnitude/phase controllers 83a-83n. In particular, use of the coupling matrix enables magnitude/phase controller output to transmit coils 85a-85n to have magnitudes and phases which allow transmit coils 85a-85n to act in a decoupled manner when providing $B_1$ field components in a subsequent MRI application.

The structure of the transmit system illustrated in FIG. 7 is similar to that illustrated in FIG. 6. Common elements are labelled with the same reference number and a detailed description of these common elements is omitted here. Unlike the embodiment illustrated in FIG. 6, the RF transmit system illustrated in FIG. 7 includes directional couplers 87a-87n respectively connected between RF power amplifiers 84a-84n and corresponding RF transmit coils 85a-85n. Each directional coupler 87a-87n forms part of a respective transmit channel and permits most of the power at its input end to pass to a respective transmit coil 85a-85n. However, each directional coupler 87a-87n extracts a tiny portion of the RF power being passed through its transmit channel. The extracted power may be a forwarded power or a reflected power of the power flowing through the transmit channel. The magnitude and phase of the RF power (forward and reflected) can be determined by measuring the RF power extracted by the directional coupler for a given channel.

Figure 8:
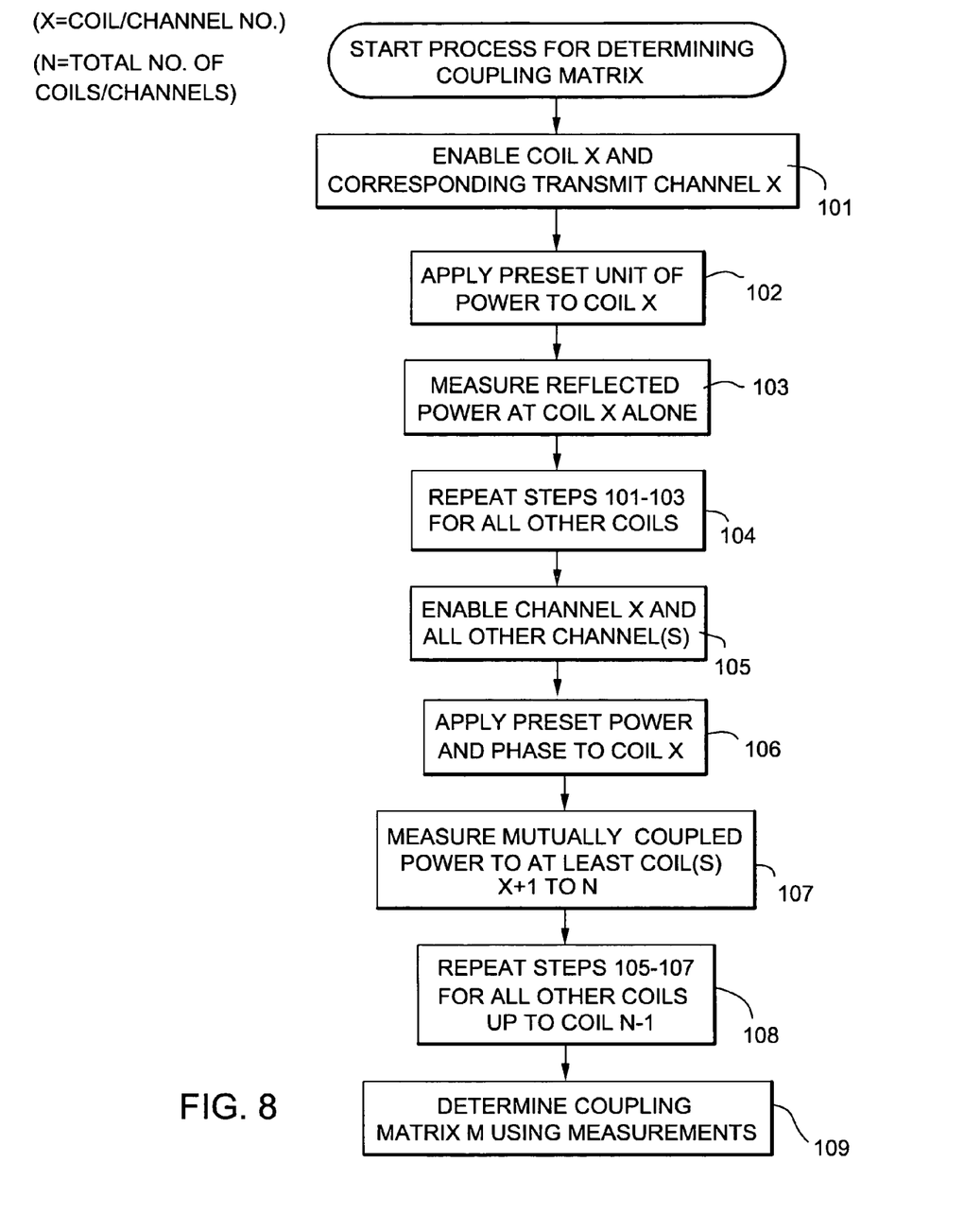
FIG. 8 is a flowchart depicting an exemplary method of operating the RF transmit system illustrated in FIG. 7.

FIG. 8 illustrates an exemplary process for operating the RF transmit system illustrated in FIG. 7 in order to initially determine a coupling matrix M before performing an MRI sequence. The first step of the process is to enable one coil and its corresponding transmit channel only (e.g., coil 1 and corresponding transmit channel 1 as coil X indicated in FIG. 8 equals 1 initially). Transmit channel 1 including magnitude/phase controller 83a, RF power amplifier 84a and directional coupler 87a apply a preset unit of power to coil 1 (coil 85a) (step 102). Directional coupler 87a in the first channel measures reflected power from coil 1 alone (step 103). Data from this measurement can be forwarded from directional coupler 87a to computer system 21 to calculate the self-coupling (resistance) of coil 1. During steps 101-103, all of the remaining coils (coils 2 to N) and corresponding channels are disabled. After the measurements for coil 1 and corresponding transmit channel 1 are completed, the same procedures including steps 101-103 can be applied to each transmit coil and corresponding transmit channel to obtain self resistance information for each of the other coils (step 104).

Mutual coupling information (e.g., mutual inductance and mutual impedance) between each pair of transmit coils 85a-85n can then be determined. Each of the channels is enabled (step 105). A preset unit (magnitude and phase) of power is applied to coil 1 (coil 85a) (step 106). The directional couplers in channels 2 to N (directional couplers 87b-87n) measure the forwarded power (magnitude and phase) at respective coils 2 through N (coils 85b-85n) (step 107) and forward corresponding data to computer system 21 for processing. Each of these respective measurements determines how much RF power is coupled from coil 1 to respective coils 2 to N directly or indirectly (with phase information). This information can be used to determine mutual coupling between coils 1 and 2, coils 1 and 3 . . . and coils 1 and N to determine entries for the coupling matrix M.

The same procedures, including steps 105-107, are then repeated for the other RF transmit coils 2, 3 etc. However, when coil 2 (coil 85b) is applied with a preset power magnitude and phase in step 106, measurements of the forwarded power from coil element 2 (in step 107) need only be taken at coils 3 to N. That is, power forwarded from coil 2 (coil 85b) to coil 1 (coil 85a) does not have to be measured at coil 1 since the mutual coupling information needed to determine that portion of the coupling matrix M between coils 1 and 2 has already been determined due to reciprocity between coupling in either direction between coils 1 and 2. It is therefore not necessary to repeat the same procedure including steps 105-107 for coil element N because all of the mutual coupling information needed to determine the coupling matrix for coil N should be derivable through reciprocity from information already obtained through previous executions of steps 105-107.

After step 108 is completed, the coupling matrix M can be fully determined based on the various empirical measurements taken in steps 101-107 (step 109). A matrix entry $M_{ij}$ will include the self resistance of one of the RF transmit coils 85a-85n when $i=j$. For example, matrix entry $M_{11}$ will include the self resistance of RF transmit coil 1 (coil 85a). The self resistance of RF transmit coil 1 is determined from measurements obtained from the execution of steps 101-103 for RF transmit coil 1 as described above. As another example, matrix entry $M_{22}$ includes the self resistance of RF transmit coil 2 (coil 85b), which is determined from measurements obtained in the execution of steps 101-103 for RF transmit coil 2. A matrix entry $M_{ij}$ will include mutual coupling (e.g., mutual inductance and mutual impedance) information when i≠j. For example, matrix entry $M_{12}$ or $M_{21}$ will include mutual coupling information determined from measurements obtained during execution of steps 105-107 when power is applied to coil 1 and forwarded power measured at coil 2 or vice versa.

The coupling matrix may then be verified. One exemplary method for verifying the validity of the coupling matrix M is to apply a virtual power source i to RF transmit coil i. If the coupling matrix M is valid, then only a directional coupler in that corresponding channel will exhibit a detected forward power. All other directional couplers (of the other channels) will show no detected RF power (i.e., no forward or reflected power).

As will be understood, the decoupling compensation matrix defines the current components added to RF transmit coil drive currents so as to cancel the undesirable currents caused by coupling between the coils. By actively adding such coupling cancellation currents the RF transmit coils are, in effect, decoupled from one another.

FIG. 9 shows an exemplary RF transmit/receive system which may be used in the MRI system illustrated in FIG. 2. The RF transmit/receive system illustrated in FIG. 9 may be implemented in an MRI system which is capable of performing measurements to determine a coupling matrix and to subsequently use the information in the coupling matrix to decouple RF transmit coils in an MRI scan of an object.

Since current generates a magnetic field and vice versa, magnetic field information can be utilized to calculated the coupling matrix M. The transmit/receive system illustrated in FIG. 9 satisfies this task. Components of the system illustrated in FIG. 9 which are similar to previously described components of other embodiments have been labelled using the same reference numbers. Only the differences from prior embodiments will be discussed in detail. The transmit/receive system illustrated in FIG. 9 includes a plurality of transmit/receive (T/R) switches 86a-86n respectively connected between the plurality of directional couplers 87a-87n and the plurality of RF transmit coils 85a-85n. The system also includes a plurality of low noise preamplifiers 88a-88n and receivers 89a-89n respectively connected to the plurality of T/R switches 86a-86n.

Figure 10:
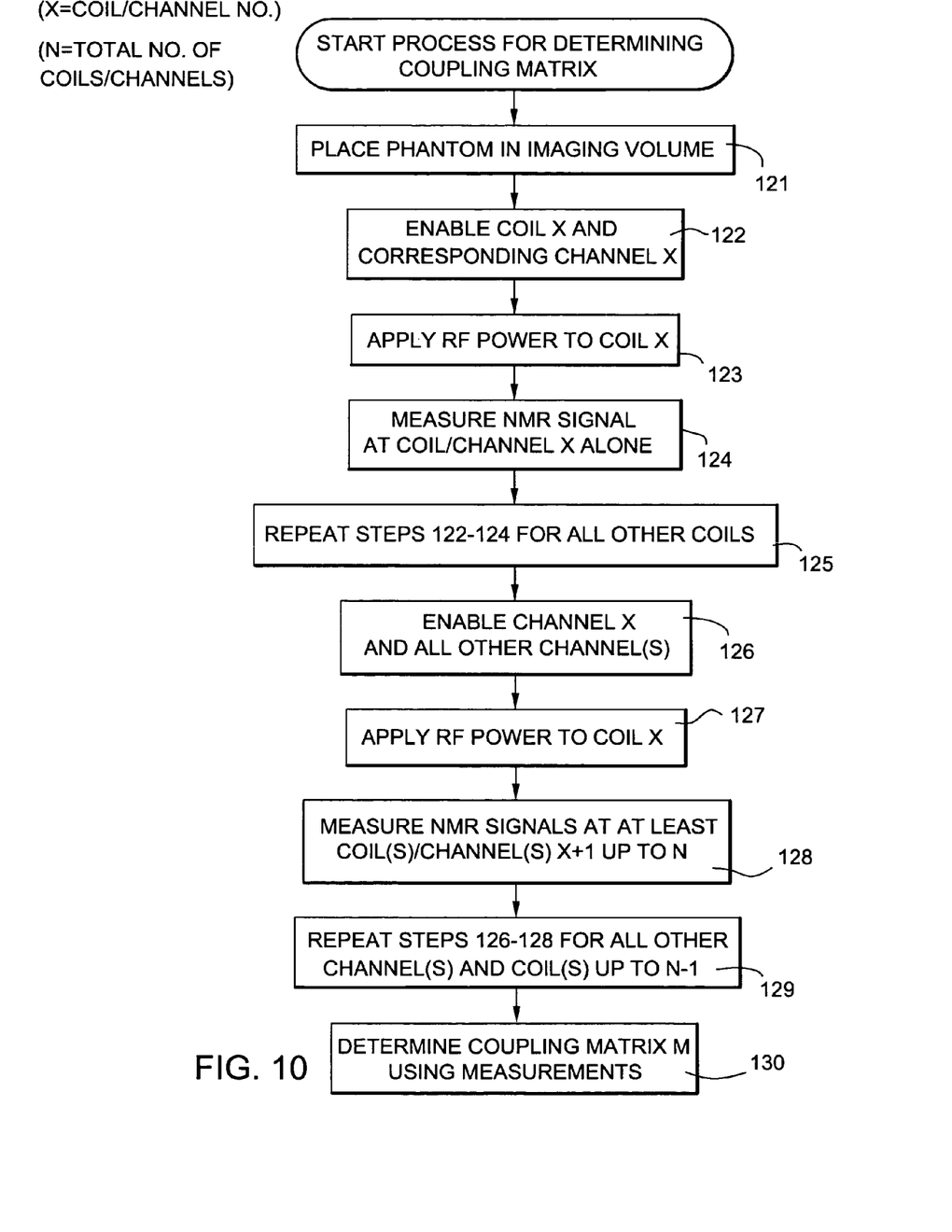
FIG. 10 is a flowchart depicting an exemplary method of operating the RF transmit/receive system illustrated in FIG. 9.

FIG. 10 illustrates an exemplary method of operating the transmit/receive system illustrated in FIG. 9 to determine a coupling matrix. The same system can then use the information of the coupling matrix to separately and independently determine the appropriate magnitude and phase of each signal driving an RF transmit coil in a subsequent MRI process to ensure that the RF transmit coils act as if they are decoupled from one other. Other benefits such as producing a uniform field are also obtained.

A suitable phantom 90 (or patient) is placed in the imaging volume of the MRI system (step 121). One of the coils and its corresponding channel is enabled (e.g., coil 1 and corresponding channel 1; X=1 initially) (step 122). RF power is then applied to coil 1 (coil 85a) (step 123). During step 123, T/R switch 1 (switch 86a) is set in the transmit position. The $B_1$ field emitted from coil 1 as a result of the applied power excites nuclear spins of the phantom (or patient) which coil 1 can later detect.

After the transmit stage is completed, T/R switch 1 (switch 86a) is switched to the receive mode. Low noise preamp 1 (preamp 88a) and receiver 1 (receiver 89a) measure the NMR signal from the excited spins of the phantom (or patient) at coil 1 and provide corresponding data to computer system 21. No other channel is enabled during the excitation and measurement by channel 1. Channel 1 therefore measures the NMR signal at channel 1 alone (step 124).

The NMR signal magnitude and phase are determined by the applied RF power. A responsive function between applied RF power and the NMR signal can be measured by this step with multiple RF power settings. Self resistance information for coil 1 can be determined based on the NMR measurements. The same procedure (including steps 122-124) are then repeated for all other coil/channels (step 125). Self resistance information can thus be determined for each of the coils.

All of the coils and channels are then enabled (step 126). RF power is applied to coil 1 via channel 1 (coil/channel X=1 initially), with all other channels/coils being enabled (step 127). The emitted RF power from coil 1 is coupled to all of the remaining coils. All of the other coils therefore generate their own $B_1$ fields which excite nuclear spins of the phantom (or patient) on their own. The low noise preamp 88n and receiver 89n in each channel receive the NMR signal from the excited spins (step 128) and provide corresponding data to computer system 21. Since the responsive function between the RF power and NMR signal has been determined, mutual coupling information between coils at a transmit stage can be calculated. This mutual coupling information is used to provide entries representing mutual inductance and/or impedance in the coupling matrix M.

The above steps including steps 126-128 are then repeated for all of the other channels and coils up to channel/coil N-1 (step 129). As discussed above, measurements in which channel/coil N would be applied with RF power to detect responses at the other channels/coils can be determined through reciprocity relationships and previously obtained data. Computer system 21 then determines and stores a coupling matrix M (step 130). The information of the coupling matrix is then available for use to separately and independently control magnitude/phase controllers 83a-83n to decouple RF transmit coils which emit $B_1$ field components in a subsequent MRI scanning process. A highly uniform field $B_1$ can be emitted during the subsequent MRI process.

The RF transmit coils do not need to be decoupled traditionally to each other in a transmit stage. However, the coils need to be decoupled with respect to each other in a receive stage traditionally because, for example, the isolation between two coils is very small. If the NMR signal of each coil is allowed to couple to each other in a receive stage, then coupling information between coils in a transmit stage may be destroyed.

Traditional phase array receive coils in MRI applications require fairly strong isolation between coil elements. Accordingly, exemplary embodiments including processes for determining the coupling matrix M as described, for example, in FIGS. 8 and 10 and subsequent use of the coupling matrix to provide excitation via a plurality of decoupled, separately and independently controllable transmit coils may be implemented on any existing multi-channel receive array coils by adding appropriate T/R switches to each coil and transmit channel (and control circuitry). Exemplary embodiments are thus analogous to B1 sensitivity calibrations of receive coils performed under SENSE reconstruction. The B1 sensitivity calibrations of the RF transmit coils are realized in the exemplary embodiments with an RF power source having multiple channels having independently adjustable magnitude and phase.

Preferably, an actual patient to be later imaged is placed in the MRI imaging volume rather than a phantom in step 121 of FIG. 10. Steps 122-130 are then completed based upon measurements taken from the patient to determine a coupling matrix M. The coupling matrix M will thus provide the basis for appropriate magnitude and phase adjustments in separately and independently controllable magnitude/phase controllers 83a-83n so that transmit coils 85a-85n may driven in a decoupled manner when the same patient is later imaged. The coupling matrix M determined using a particular patient may also be used as the basis for determining appropriate magnitude and phase of transmit coil driving signals for a second (different) patient as long as the properties relating to MRI for the first patient (who was used in the performance of steps 121-130 to determine the coupling matrix) is sufficiently similar to those of the second patient.

While the above exemplary embodiments have been described, those in the art will understand that many variations, modifications and equivalent arrangements may be used while still retaining some or all of the novel features and advantages of this invention and thus fall within the intended scope of the claims.

What is claimed is:

1. An RF transmit system for use in an MRI system, the RF transmit system comprising:
   a plurality of RF transmit coils;
   each said coil having an RF drive with separately controllable magnitude and phase; and
   a control system connected to control phase and magnitude of RF signals that respectively drive the RF transmit coils so that the RF transmit coils act as if they are decoupled from each other based on self resistance and mutual coupling of the RF transmit coils.

2. An RF transmit system as in claim 1 wherein an RF power amplifier and a RF power splitter provide a separate RF drive channel for each coil.

3. An RF transmit system as in claim 2 wherein the RF power splitter is a 50 ohm RF power splitter.

4. An RF transmit system as in claim 1 wherein an RF signal generator and a signal splitter provide a separate RF drive channel for each coil.

5. An RF transmit system as in claim 4 further comprising plural power amplifiers as separate power amplifiers being connected to drive each of the plurality of RF transmit coils.

6. An RF transmit system as in claim 1 further comprising a plurality of directional RF couplers, each being connected to a respective one of the plurality of RF transmit coils.

7. An RF transmit system as in claim 6 further comprising a plurality of RF transmit/receive switches, each being connected between a respectively corresponding one of the plurality of directional couplers and a respectively corresponding one of the plurality of RF transmit coils.

8. An RF transmit system as in claim 1 further comprising a plurality of transmit/receive switches, each being connected between a respectively corresponding one of plural magnitude and phase controllers and a respectively corresponding one of the plurality of the RF transmit coils.

9. An RF transmit system as in claim 1 wherein the mutual coupling is empirically derived as a result of a previous operation of the RF transmit system.

10. An RF transmit system as in claim 1 wherein the mutual coupling comprises mutual inductance and mutual impedance of the transmit coils, and the control system respectively provides separate control signals to each of a plurality of magnitude and phase controllers based on the self resistance, mutual inductance and mutual impedance of the transmit coils.

11. An RF transmit system as in claim 10 wherein the self resistance, mutual inductance and mutual impedance are empirically derived as a result of a previous operation of the RF transmit system.

12. An RF transmit system as in claim 10 wherein the self resistance, mutual inductance and mutual impedance forms a matrix M, an entry $M_{ij}$ of the matrix M representing a transmit coil self resistance when i=j, and representing mutual inductance and mutual impedance between two transmit coils when i≠j.

13. An RF transmit system as in claim 1 wherein the control system:
   drives a first of the RF transmit coils with an RF signal having predetermined magnitude and phase;
   measures reflected power at the first of the RF transmit coils;
   determines a self resistance of the first of the RF transmit coils based on the measured reflected power; and
   drives the respective RF transmit coils based on said self resistance, including the determined self resistance of the first of the RF transmit coils, as well as said mutual coupling of the RF transmit coils.

14. An RF transmit system as in claim 1 wherein the control system:
   (a) drives one of the RF transmit coils with predetermined magnitude and phase;
   (b) measures forwarded power at each of the other RF transmit coils;
   (c) determines mutual coupling between the driven RF transmit coil and each of the other RF transmit coils based on measured forwarded power;
   (d) repeats (a)-(c) for each of the RF transmit coils so that said mutual coupling on which said phase and magnitude of RF signals are controlled to respectively drive the RF transmit coils so that the RF transmit coils act as if they are decoupled from each other includes mutual coupling between all the RF transmit coils.

15. A method of operating an MRI system comprising a plurality of RF transmit coils and a plurality of separate magnitude and phase controllers, each respectively connected to one of the plurality of RF transmit coils, the method comprising:
   using the plurality of RF transmit coils to obtain empirical data;
   processing the empirical data to determine self resistance and coupling of the RF transmit coils; and
   separately controlling the magnitude and phase controllers based on the determined self resistance and coupling in a subsequent MRI operation to control RF phase and magnitude of RF drive for each of the RF transmit coils so that the RF transmit coils act as if they are decoupled from each other.

16. A method as in claim 15 wherein the determined coupling comprises information relating to mutual inductance and mutual impedance between each of the transmit coils.

17. A method as in claim 15 wherein data values representing the self resistance and coupling form a coupling matrix M, an entry $M_{ij}$ of the matrix M representing a RF transmit coil self resistance when i=j, and representing mutual coupling between two RF transmit coils when i≠j.

18. A method as in claim 15 wherein the empirical data is obtained by the MRI system when a patient is coupled to the transmit coils and the subsequent MRI operation comprises an MRI scan of the same patient.

19. A method as in claim 15 wherein the empirical data is obtained by the MRI system when a patient is coupled to the transmit coils and the subsequent MRI operation comprises an MRI scan of a different patient.

20. A method of operating an MRI system comprising a plurality of RF transmit coils, the method comprising:
driving a first RF transmit coil with a signal having a predetermined magnitude and phase;
measuring forwarded power from at least a second RF transmit coil due to said first RF transmit coil being driven;
determining mutual coupling between the first and second RF transmit coils based on the measured forwarded power; and
separately driving the first and second RF transmit coils with RF power having magnitude and phase control based on the determined mutual coupling so that the first and second transmit coils act as if they are decoupled from one another;
driving the first RF transmit coil with an RF signal having predetermined magnitude and phase;
measuring reflected power at the first RF transmit coil; and
determining self resistance of the first RF transmit coil based on the measured reflected power;
wherein driving of the first and second RF transmit coils is based on self resistance as well as mutual coupling.

21. A method as in claim 20 wherein the determined mutual coupling comprises mutual inductance and mutual impedance between the first and second transmit coils.

22. A method as in claim 20 wherein the forwarded power measured at the second RF transmit coil is measured via a directional coupler connected to the second RF transmit coil.

23. A method as in claim 20 wherein the MRI system further comprises a plurality of directional couplers, each being respectively connected to a corresponding one of the plurality of RF transmit coils, the reflected power at the first RF transmit coil being measured via a directional coupler connected to the first RF transmit coil and the forwarded power measured at the second RF transmit coil being measured via a directional coupler connected to the second RF transmit coil.

24. A method as in claim 20 further comprising:
driving the second RF transmit coil with predetermined magnitude and phase;
measuring reflected power at the second RF transmit coil; and
determining self resistance of the second RF transmit coil based on the measured reflected power;
wherein driving of the first and second RF transmit coils is based on self resistance of the first RF transmit coil, self resistance of the second RF transmit coil, and mutual coupling therebetween.

25. A method as in claim 24 wherein the self resistance of the first RF transmit coil, self resistance of the second RF transmit coil, and mutual coupling form a matrix M in which matrix entry $M_{11}$ represents self resistance of the first RF transmit coil, matrix entries $M_{12}$ and $M_{21}$ represent mutual coupling information, and matrix entry $M_{22}$ represents self resistance of the second RF transmit coil.

26. A method of operating an MRI system comprising a plurality of RF transmit coils, the method comprising:
(a) driving one of the RF transmit coils with predetermined magnitude and phase;
(b) measuring forwarded power at each of the other RF transmit coils and reflected power at the driven RF transmit coil;
(c) determining mutual coupling between the driven RF transmit coil and each of the other RF transmit coils based on measured forwarded power and determining self resistance of the driven RF transmit coil based on measured reflected power; and
(d) driving each of the RF transmit coils using separate magnitude and phase control based on the determined mutual coupling and self resistance so that each of the RF transmit coils act as if it is decoupled from the other.

27. A method of operating an MRI system comprising a plurality of RF transmit coils, the method comprising:
(a) driving one of the RF transmit coils with predetermined magnitude and phase;
(b) measuring forwarded power at each of the other RF transmit coils;
(c) determining mutual coupling between the driven RF transmit coil and each of the other RF transmit coils based on measured forwarded power;
(d) driving each of the RF transmit coils using separate magnitude and phase control based on the determined mutual coupling so that each of the RF transmit coils act as if it is decoupled from the other; and
repeating steps (a)-(c) for each of the RF transmit coils so that the determined mutual coupling on which step (d) is based includes mutual coupling between all the RF transmit coils.

28. A method of operating an MRI system comprising a plurality of RF transmit coils, the method comprising:
(a) driving one of the RF transmit coils with predetermined magnitude and phase;
(b) measuring forwarded power at each of the other RF transmit coils;
(c) determining mutual coupling between the driven RF transmit coil and each of the other RF transmit coils based on measured forwarded power;
(d) driving each of the RF transmit coils using separate magnitude and phase control based on the determined mutual coupling so that each of the RF transmit coils act as if it is decoupled from the other;
(e) driving successive ones of said RF transmit coils with known magnitude and phase;
(f) measuring forwarded power at each RF transmit coil except the earlier driven RF transmit coils; and
(g) determining mutual coupling between the driven RF transmit coil and each of the other RF transmit coils except for earlier driven RF transmit coils based on measured forwarded power; and
wherein the determined mutual coupling on which control of the RF transmit coils is based includes mutual coupling determined in step (g).

29. A method of operating an MRI system comprising a plurality of RF transmit coils, the method comprising:
(a) placing an object in an imaging volume of the MRI system;
(b) driving a first RF transmit coil coupled to said object;
(c) measuring an NMR response from the object at a second RF transmit coil;
(d) determining mutual coupling between the first and second RF transmit coils based on the measured NMR response;
(e) driving the first and second transmit RF transmit coils using separate magnitude and phase control based on the determined mutual coupling so that the first and second transmit coils act as if they are decoupled from one another; and
repeating steps (b)-(d) for the second RF transmit coil so that the determined mutual coupling on which step (e) is based includes mutual coupling between all of the first and second RF transmit coils.

30. A method as in claim 29 wherein the mutual coupling comprises mutual inductance and mutual impedance between the first and second transmit coils.

31. A method as in claim 29 wherein the object is a phantom.

32. A method as in claim 29 wherein object is patient, and driving the first and second transmit RF transmit coils using separate control based on mutual coupling is performed in an MRI scan of the same patient.

33. A method as in claim 29 wherein object is patient, and driving the first and second transmit RF transmit coils using separate control based on mutual coupling is performed in an MRI scan of a different patient.

34. A method of operating an MRI system comprising a plurality of RF transmit coils, the method comprising:
    placing an object in an imaging volume of the MRI system;
    driving a first RF transmit coil coupled to said object;
    measuring an NMR response from the object at a second RF transmit coil;
    determining mutual coupling between the first and second RF transmit coils based on the measured NMR response;
    driving the first and second transmit RF transmit coils using separate magnitude and phase control based on the determined mutual coupling so that the first and second transmit coils act as if they are decoupled from one another;
    driving the first RF transmit coil;
    measuring an NMR response at the first RF transmit coil; and
    determining self resistance of the first RF transmit coil based on the measured NMR response;
    wherein the separate control for driving the first and second transmit RF transmit coils is based on self resistance as well as mutual coupling.

35. A method as in claim 34 further comprising:
    driving the second RF transmit coil;
    measuring an NMR response at the second RF transmit coil; and
    determining self resistance of the second RF transmit coil based on the measured NMR response;
    wherein the separate control for driving the first and second transmit RF transmit coils is based on self resistance of the first RF transmit coil, self resistance of the second RF transmit coil, and mutual coupling.

36. A method as in claim 35 wherein self resistance of the first RF transmit coil, self resistance of the second RF transmit coil, and mutual coupling form a matrix in which matrix entry $M_{11}$ represents self resistance information of the first RF transmit coil, matrix entries $M_{12}$ and $M_{21}$ represent mutual coupling information, and matrix entry $M_{22}$ represents self resistance information of the second RF transmit coil.

37. A method of operating an MRI system comprising a plurality of RF transmit coils and a plurality of separately controllable magnitude and phase controllers, each respectively connected to a corresponding one of the plurality of RF transmit coils, the method comprising:
    using the plurality of RF transmit coils to obtain empirical data;
    processing the empirical data to determine mutual coupling between the RF transmit coils and self resistance for each RF transmit coil; and
    separately controlling the magnitude and phase controllers based on the determined mutual coupling and self resistance in a subsequent MRI operation.

38. A method as in claim 37 wherein the magnitude and phase controllers are separately controlled so that they output respective signals to the RF transmit coils to enable the RF transmit coils to act as if they are decoupled from each other.

39. A method as in claim 37 wherein the self resistance and mutual coupling form a coupling matrix M, an entry $M_{ij}$ of the matrix M representing a RF transmit coil self resistance when i=j, and representing mutual coupling between two RF transmit coils when i≠j.

40. A method as in claim 37 wherein the mutual coupling comprises mutual inductance and mutual impedance between two RF transmit coils.

* * * * *